(12) United States Patent
Yang

(10) Patent No.: US 7,466,016 B2
(45) Date of Patent: Dec. 16, 2008

(54) BENT LEAD TRANSISTOR

(76) Inventor: Kevin Yang, 1225 Via Coronel, Palos Verdes Est., CA (US) 90274

( * ) Notice: Subject to any disclaimer, the term of this patent is extended or adjusted under 35 U.S.C. 154(b) by 102 days.

(21) Appl. No.: 11/784,763

(22) Filed: Apr. 7, 2007

(65) Prior Publication Data

US 2008/0246128 A1   Oct. 9, 2008

(51) Int. Cl.
*H01L 23/48* (2006.01)
*H01L 23/12* (2006.01)
*H01L 23/495* (2006.01)

(52) U.S. Cl. .............................. 257/676; 257/E23.043; 257/E23.066; 257/675; 257/712; 257/713; 257/717; 257/670; 257/671; 257/672; 257/674; 257/666; 257/696; 257/707; 257/698; 257/690

(58) Field of Classification Search .................. 257/676, 257/E23.066, E23.043, 786, 690, 691, 692, 257/696, 698, 675, 677, 707, 712, 713, 717, 257/706, 788, 670, 671, 672, 674, 796, 666, 257/693
See application file for complete search history.

(56) References Cited

U.S. PATENT DOCUMENTS

| | | | | |
|---|---|---|---|---|
| 3,597,666 A | * | 8/1971 | Taskovich | 257/674 |
| 3,778,887 A | * | 12/1973 | Suzuki et al. | 29/827 |
| 4,530,003 A | * | 7/1985 | Blair et al. | 257/675 |
| 5,038,200 A | * | 8/1991 | Hosomi et al. | 257/796 |
| 5,276,352 A | * | 1/1994 | Komenaka et al. | 257/666 |
| 5,581,118 A | * | 12/1996 | Mays | 257/666 |
| 5,825,794 A | * | 10/1998 | Ogino et al. | 372/36 |
| 5,998,856 A | * | 12/1999 | Noda et al. | 257/666 |
| 6,008,074 A | * | 12/1999 | Brand | 438/126 |
| 6,107,676 A | * | 8/2000 | Suzuki | 257/666 |
| 6,114,750 A | | 9/2000 | Udagawa | |
| 6,577,503 B2 | * | 6/2003 | Kinsman et al. | 361/704 |
| 6,977,432 B2 | * | 12/2005 | Crane et al. | 257/696 |

\* cited by examiner

*Primary Examiner*—Alexander O Williams
(74) *Attorney, Agent, or Firm*—Clement Cheng

(57) ABSTRACT

A metal backing tab supports the semiconductor device and has an extending portion extending from an edge. A top leg, a middle leg and a bottom leg are all coupled to the semiconductor device and each has a lead terminal portion extending beyond the boundary of said molded housing. The top leg has a first top leg section that protrudes directly away from the molded housing, a second top leg section that bends toward a direction of a face of the molded housing, and a third top leg section bending downward. The middle leg has a first middle leg section connected to the package that protrudes away from the molded housing, and a middle leg downward section that points downward. The bottom leg has a first bottom leg section that protrudes away from the molded housing face, a second bottom leg section that points away from the molded housing face, and third bottom leg section that points downward.

9 Claims, 2 Drawing Sheets

BENT LEAD TRANSISTOR

FIELD OF THE INVENTION

The invention generally relates to a conductive lead frame for a transistor electronic component package.

DISCUSSION OF RELATED ART

Electronic components are typically encapsulated in a molded plastic package and optionally include a heat dissipation plate and leads are legs extending from the molded plastic package. A wide variety of electronic components exist in a wide variety of mechanical and electronic configurations.

In a standard transistor package such as a TO-220 package, the transistor has three legs formed of relatively flat metallic members. The package typically also has a back side with a metal tab. The metal tab can dissipate a couple of Watts on its own and can be used to connect with a heatsink that is mechanically connected to the tab hole such as by fastening hardware such as a bolt or a screw. A wide variety of transistors are now leadfree and available in a number of different configurations such as 100 Volt, 55 Volt in P-Channel and N-Channel type. Other packages such as TO-126 are also available in a wide variety of configurations.

In the present state of the art, the standard package is available in only one mechanical configuration. Sometimes other mechanical configurations should be used instead of the current standard package.

A notable modification to the physical configuration includes a surface mount TO-220 package and process for the manufacture thereof discussed in U.S. Pat. No. 6,114,750 by inventor Udagawa filed Sep. 30, 1997, the disclosure of which is incorporated in its entirety by reference. The Udagawa reference shows that the prior art configuration has a plate, a device portion where the semiconductor is located, a package typically made of non-conductive material, wire bonds leading from the device portion to the lead terminals typically formed as legs. The Udagawa device encapsulates the bent portion of the lead terminals which are typically located outside of the package so that they protrude from the package. By encapsulating the bended portion of the lead terminals inside the package, the Udagawa device reduces mechanical stresses.

SUMMARY OF THE INVENTION

Figure 3:
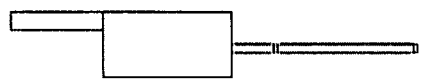
FIG. 3 is a side view of the prior art.

The present invention includes a semiconductor device such as a transistor electronic component encapsulated in electrically insulating material. The electrical insulating material is a package typically an encapsulated molded housing. The electronic component has three electrical leads, also called legs which are typically mounted in or otherwise soldered onto holes of a printed circuit board. The semiconductor device such as a transistor has a metal backing tab. The tab has a hole that allows a screw attachment to a heat sink. The package has a generally flat and generally rectangular front face. A rear surface shows the metal backing tab that protrudes from the package. The front face has a height and a width that are greater than the thickness of the package. The front face height and width should be approximately twice the thickness of the package.

The package also has a top and bottom surface. The metal backing tab is effective to function as a heatsink and extends outside the boundary of the molded housing. The conductive lead frame supports a semiconductor device encapsulated in a molded housing. The lead frame comprises a metal backing tab which supports the semiconductor device and has an extending portion extending from an edge thereof that extends beyond a boundary of the molded housing.

The legs protrude from the package at regular intervals and are bent so that the top leg protrudes away from the package, then bends toward the direction of the face of the package, then bends downward. The top leg has a bend that preferably forms an angle of about 120° between a first top leg section that protrudes directly away from the package, and a second top leg section that bends toward the direction of the face of the package. The third leg section bending downward is preferably in an angle of 90° with the second leg section.

The middle leg protrudes from the package, then bends downward. The middle leg has a first section connected to the package that protrudes away from the package. The middle leg has a middle leg second section that points downward. The angle between the middle leg first section and middle leg second section is preferably a 90° angle.

The bottom leg bends away from the face of the package, then bends downward. The bottom leg has a bottom leg first section that protrudes away from the package. The bottom leg has a bottom leg second section that points away from the face of the package. The bottom leg first section and bottom leg second section preferably have a 120° angle between them. The bottom leg third section points downward and forms an angle of 90° with the bottom leg second section.

Alternatively, the top leg and the bottom leg bending can be reversed. The top leg can be bent away from the package face instead of toward the package face, and the bottom leg can be bent toward the package face instead of away from the package face.

The legs can be preformed in the bended position, and the legs can be bent by metal bending techniques known in the art. The legs are connected to the transistor inside the package via wire bonds. The transistor inside the package is thermally connected to the metal heat conducting plate formed as a tab and mounted on the back of the package. The back of the package opposes the front of the package. The tab protruding from the top of the package typically and optionally has an attachment aperture for use in connection with heatsink or fins.

The generally rectangular features of the present invention can also be made in rounded configurations. Preferably, the legs are formed as flat rectangular cross-sections. The tips of the legs are preferably rounded to allow easy insertion into a circuit board. The tips of the legs can also be appropriately trimmed if necessary.

The main object of the invention is to provide an alternative mechanical configuration that can be more compact and low profile.

DETAILED DESCRIPTION OF THE PREFERRED EMBODIMENT

Figure 1:
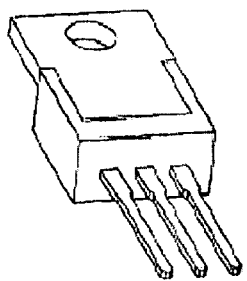
FIG. 1 is a perspective view of the prior art.
Figure 2:
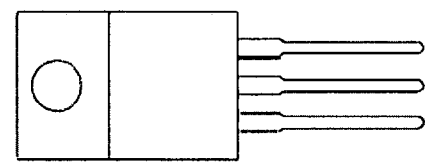
FIG. 2 is a front view of the prior art.
Figure 5:
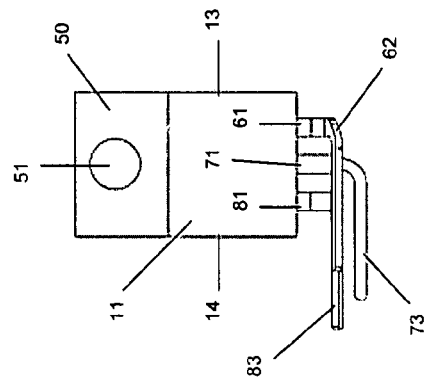
FIG. 5 is a front view of the present invention.
Figure 7:
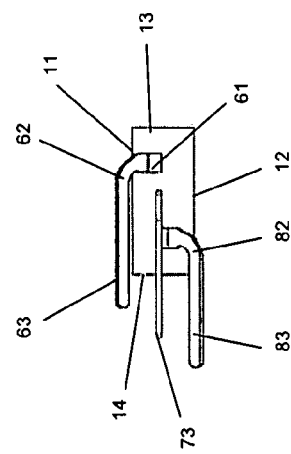
FIG. 7 is a side view of the present invention.

The detailed description begins with FIG. 1, which is prior art and indicator of a typical TO-220 package. FIG. 1 is a perspective view of the prior art, FIG. 2 is a front view of the prior art and FIG. 3 is a side view of the prior art.

Figure 4:
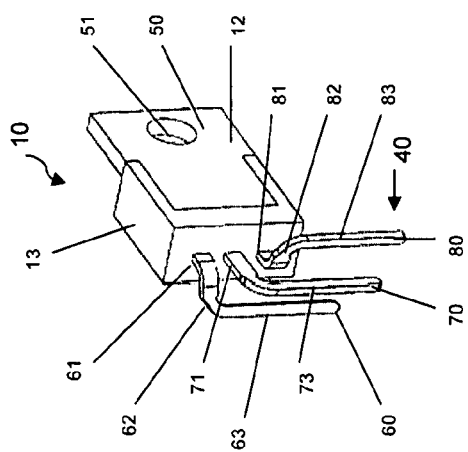
FIG. 4 is a perspective view of the present invention.
Figure 6:
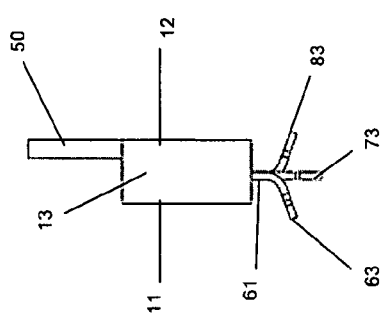
FIG. 6 is a side view of the present invention.

The present invention as shown in FIG. 4 includes a semiconductor device such as a transistor electronic component encapsulated in electrically insulating material. The electronic component has three electrical leads 40, also called legs 40 which are typically mounted in or otherwise soldered onto holes of a printed circuit board. The semiconductor device such as a transistor has a metal backing tab 50. The tab has a tab hole 51 that allows a screw attachment to a heat sink. The tab hole 51 as shown has an axis that is perpendicular to the plane of the metal backing tab 50.

The package 10 has a generally flat and generally rectangular front face 11. A rear surface 12 shows the metal backing tab 50 that protrudes from the package. The front face 11 has a height and a width that are greater than the thickness of the package. The front face height and width should be approximately twice the thickness of the package.

The package also has a top package surface 13 and bottom package surface 14.

The legs 40 protrude from the package at regular intervals and are bent so that the top leg 60 protrudes away from the package, then bends toward the direction of the face of the package, then bends downward. The top leg has a bend that preferably forms an angle of about 120° between a first top leg section 61 that protrudes directly away from the package, and a second top leg section 62 that bends toward the direction of the face of the package. The third leg section 63 bending downward is preferably in an angle of 90° with the second leg section.

The middle leg 70 protrudes from the package, then bends downward. The middle leg 70 has a first section 71 connected to the package that protrudes away from the package. The middle leg 70 has a middle leg second section that follows the middle leg first section 71 again pointing away from the package. The middle leg third section 73 points downward and follows the middle leg first section 71 and middle leg second section 72. The angle between the middle leg first section 71 and middle leg second section 73 is preferably a 90° angle.

The bottom leg 80 bends away from the face of the package, then bends downward. The bottom leg 80 has a bottom leg first section 81 that protrudes away from the package. The bottom leg 80 has a bottom leg second section 82 that points away from the face of the package. The bottom leg first section 81 and bottom leg second section 82 preferably have a 120° angle between them. The bottom leg third section 83 points downward and forms an angle of 90° with the bottom leg second section 82.

Alternatively, the top leg 60 and the bottom leg 80 bending can be reversed. The top leg 60 can be bent away from the package face 11 instead of toward the package face 11, and the bottom leg 80 can be bent toward the package face 11 instead of away from the package face 11.

The legs 40 can be preformed in the bended position, and the legs 40 can be bent by metal bending techniques known in the art. The legs 40 are connected to the transistor inside the package via wire bonds. The semiconductor device such as a transistor inside the package is thermally connected to the metal heat conducting plate 50 formed as a tab 50 and mounted on the back of the package 12. The back of the package 12 opposes the front of the package 11. The tab 50 protruding from the package typically and optionally has an attachment aperture 51 for use in connection with heatsink or fins. Attachment aperture 51 is another name for a hole 51.

The generally rectangular features of the present invention can also be made in rounded configurations. Preferably, the legs are formed as flat rectangular cross-sections. The tips of the legs are preferably rounded to allow easy insertion into a circuit board. The tips of the legs can also be appropriately trimmed if necessary.

The invention claimed is:

1. A conductive lead frame for supporting a semiconductor device encapsulated in a molded housing, the lead frame comprising:

a metal backing tab which supports the semiconductor device and has an extending portion extending from an edge thereof that extends beyond a boundary of the molded housing; and a top leg, a middle leg and a bottom leg;

wherein the top leg, the middle leg and the bottom leg are all coupled to the semiconductor device each having a lead terminal portion extending beyond the boundary of said molded housing, wherein each of the three legs protrude from the molded housing, wherein the top leg has a first top leg section that protrudes directly away from the molded housing, and a second top leg section that bends toward a direction of a face of the molded housing, and a third top leg section bending downward, wherein the middle leg has a first middle leg section connected to the package that protrudes away from the molded housing, and a middle leg downward section that points downward, wherein the bottom leg has a first bottom leg section that protrudes away from the molded housing face, and a second bottom leg section that points away from the molded housing face, and third bottom leg section that points downward, wherein the metal backing tab is effective to function as a heatsink and extends outside the boundary of the molded housing.

2. The conductive lead frame of claim 1, wherein the first bottom leg section forms a 120° angle with the second bottom leg section.

3. The conductive lead frame of claim 1, wherein the first top leg section forms a 120° angle with the second top leg section.

4. The conductive lead frame of claim 1, wherein the first middle leg section forms a 120° angle with the middle leg downward section.

5. The conductive lead frame of claim 1, wherein the second bottom leg section forms a 90° angle with the third bottom leg section.

6. The conductive lead frame of claim 1, wherein the second top leg section forms a 90° angle with the third top leg section.

7. The conductive lead frame of claim 1, wherein the first bottom leg section forms a 120° angle with the second bottom leg section; the first top leg section forms a 120° angle with the second top leg section; and the first middle leg section forms a 120° angle with the middle leg downward section.

8. The conductive lead frame of claim 1, wherein the second bottom leg section forms a 90° angle with the third bottom leg section and the second top leg section forms a 90° angle with the third top leg section.

9. The conductive lead frame of claim 1, wherein the first bottom leg section forms a 120° angle with the second bottom leg section; the first top leg section forms a 120° angle with the second top leg section; the first middle leg section forms a 120° angle with the middle leg downward section; and wherein the second bottom leg section forms a 90° angle with the third bottom leg section and the second top leg section forms a 90° angle with the third top leg section.

* * * * *